(12) United States Patent
Callahan et al.

(10) Patent No.: US 6,633,489 B2
(45) Date of Patent: Oct. 14, 2003

(54) DYNAMIC ISOLATING MOUNT FOR PROCESSOR PACKAGES

(75) Inventors: Daniel L. Callahan, Nashua, NH (US); Raymond J. Iannuzzelli, Amherst, NH (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 57 days.

(21) Appl. No.: 09/919,295

(22) Filed: Jul. 31, 2001

(65) Prior Publication Data

US 2003/0026070 A1 Feb. 6, 2003

(51) Int. Cl.[7] .............................. H05K 7/12; H05K 7/00
(52) U.S. Cl. ....................... 361/771; 361/764; 361/767; 361/762
(58) Field of Search ................................. 361/679–686, 361/748, 760–762, 764, 767, 772

(56) References Cited

U.S. PATENT DOCUMENTS

| 2,018,860 | A | * | 10/1935 | Lord .......................... 267/141.4 |
|---|---|---|---|---|
| 2,132,840 | A | * | 10/1938 | Workman et al. ............ 105/422 |
| 3,007,997 | A | * | 11/1961 | Panariti ................... 174/117 R |
| 3,083,259 | A | * | 3/1963 | Wells .......................... 174/255 |
| 3,801,874 | A | * | 4/1974 | Stefani ........................ 174/16.3 |
| 3,813,582 | A | * | 5/1974 | Gikow ......................... 361/753 |
| 3,863,881 | A | * | 2/1975 | Fletcher et al. .............. 248/634 |
| 4,053,943 | A | * | 10/1977 | Galvin ......................... 188/266 |
| 4,382,587 | A | * | 5/1983 | Heinrich et al. ............. 188/378 |
| 4,566,231 | A | * | 1/1986 | Konsevich ................... 181/208 |
| 4,954,878 | A | * | 9/1990 | Fox et al. ..................... 257/675 |
| 5,014,161 | A | * | 5/1991 | Lee et al. ..................... 361/709 |
| 5,213,879 | A | * | 5/1993 | Niwa et al. .................. 428/213 |
| 5,253,129 | A | * | 10/1993 | Blackborow et al. .......... 360/69 |
| 5,435,737 | A | * | 7/1995 | Haga et al. .................. 439/157 |
| 5,552,209 | A | * | 9/1996 | McCutcheon ................ 428/209 |
| 5,729,433 | A | * | 3/1998 | Mok ............................ 257/727 |
| 5,770,891 | A | * | 6/1998 | Frankeny et al. ............. 257/698 |
| 5,858,509 | A | * | 1/1999 | Polch et al. .................. 428/166 |
| 6,038,128 | A | * | 3/2000 | Hood et al. .................. 174/15.2 |
| 6,293,331 | B1 | * | 9/2001 | Wang ........................... 165/185 |
| 6,349,032 | B1 | * | 2/2002 | Chan et al. ................... 257/718 |

FOREIGN PATENT DOCUMENTS

JP          06042578 A * 2/1994 ............ F16F/15/02

* cited by examiner

*Primary Examiner*—Anatoly Vortman

(57) ABSTRACT

The present invention relates to a method and apparatus that prevents/minimizes cracking in the ceramic body of processors. The ability to prevent/minimize cracking can ensure successful operation and substantially increase processor lifetime. The present invention discloses a device for maintaining a microprocessor in a desired relationship with a printed wiring board while limiting the transmission of shock and vibrational motion to and from the processor includes a printed wiring board, a processor, and a dynamic isolating mount compressed between the printed wiring board and the processor, wherein the processor maintains the dynamic isolating mount in a compressed state such that the dynamic isolating mount bears on the printed wiring board.

7 Claims, 2 Drawing Sheets

DYNAMIC ISOLATING MOUNT FOR PROCESSOR PACKAGES

CROSS-REFERENCE TO RELATED APPLICATIONS

The subject matter of the present application is related to the subject matter of co-pending application entitled "Tunable Vibration Damper for Processor Packages," incorporated herein by reference.

STATEMENT REGARDING FEDERALLY SPONSORED RESEARCH OR DEVELOPMENT

Not applicable.

BACKGROUND OF THE INVENTION

1. Field of the Invention

The present invention generally relates to protecting microprocessors from overstress caused by sudden forces or impacts. More particularly, the present invention relates to a dynamic isolating mount for a microprocessor package.

2. Background of the Invention

For many decades, circuit boards, such as those used in computers, have been manufactured by attaching electrical components to the board. In some cases, the components are soldered directly to the board. Although generally satisfactory, soldering a component directly to the board makes it difficult and costly to change that component should it be desired or necessary to replace one component with another. A microprocessor, for example, may have hundreds of connections that, should the processor fail, must be desoldered. A new processor, with its hundred of connections must then be attached to the board. Further, this process must occur without damaging the other components mounted on the circuit board. Even if the processor has not failed, it still might be desired to replace it, for example, a new and improved version of the processor is made available.

For these and other reasons, "interposer" sockets have became available. Although defined in various ways, an interposer socket is a socket to which a chip (i.e., a microprocessor) is mated. The socket is then mated to the circuit board or to a socket soldered to the circuit board. Advantageously, an interposer socket does not require solder either to be mated to the board (or other socket) or to the electrical component mounted on it. Instead, a lever or other mechanism is engaged to hold the interposer socket to the circuit board.

As technology has progressed, some chips (i.e., microprocessors) have become more powerful and accordingly consume more electrical power. This increase in power usage causes the chips to become hotter and larger heat sinks are required to dissipate the increased thermal load. Mounting a large chip with a heat sink in an interposer socket may be problematic in the face of shock/vibration loads.

For example, motion caused by a fan, opening and closing cabinet doors in a rack of computers, seismic activity, and vibration induced by adjacent equipment may cause the ceramic body of a chip to crack and ultimately fail. Obviously, this failure may cause the electrical component contained in the interposer to cease functioning as intended.

For successful operation and prevention of premature chip failure, the source of the vibration should be eliminated. If this is impossible or difficult, then a vibration isolation device should be used at or near the socket to minimize the potential for the chip to fail.

BRIEF SUMMARY OF THE INVENTION

The present invention relates to a method and apparatus that prevents/minimizes cracking in the ceramic body of chips. The ability to prevent/minimize cracking can ensure successful operation and substantially increase processor lifetime.

In accordance with a preferred embodiment of the present invention, a device for maintaining a microprocessor in a desired relationship with a printed wiring board while limiting the transmission of shock and vibrational motion to and from the processor includes a printed wiring board, a processor, and a dynamic isolating mount compressed between the printed wiring board and the processor, wherein the processor maintains the dynamic isolating mount in a compressed state such that the dynamic isolating mount bears on the printed wiring board.

In accordance with another preferred embodiment of the present invention, a method for limiting shock/vibrational motion of a microprocessor includes placing a dynamic isolating mount between a processor and printed wiring board.

In accordance with yet another preferred embodiment of the present invention, a method for preventing cracking of the ceramic body of a microprocessor includes placing a dynamic isolating mount on a printed wiring board where the printed wiring board contacts the processor.

These and other aspects of the present invention will become apparent upon studying the following detailed description, figures and claims.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a given component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device "couples" to a second device, that connection may be through a direct electrical connection, or through an indirect electrical connection via other devices and connections. To the extent that any term is not specially defined in this specification, the intent is that the term is to be given its plain and ordinary meaning.

DETAILED DESCRIPTION OF THE PREFERRED EMBODIMENTS

Currently, there is desire to mount CPUs in area array interposer sockets. The manner of mounting a CPU in an interposer socket requires supporting the ceramic body at discrete locations around the periphery of the device. Because the ceramic body of high performance processors is brittle, these support points can then become origins for cracks when the device is subjected to assembly and impact type forces. The present invention provides a positive means for controlling cracking in the ceramic body of the processor by providing assembly support and shock/vibration isolation through an energy dissipation device, or dynamic isolating mount.

The preferred embodiment of the invention is described below in the context of a processor chip and heat sink combination mounted on a circuit board with an interposer socket. It should be noted, however, that the chip need not be a processor nor is the heat sink required. Broadly, the invention is useful to reduce vibration for any type of component mounted to a circuit board.

Figure 1:
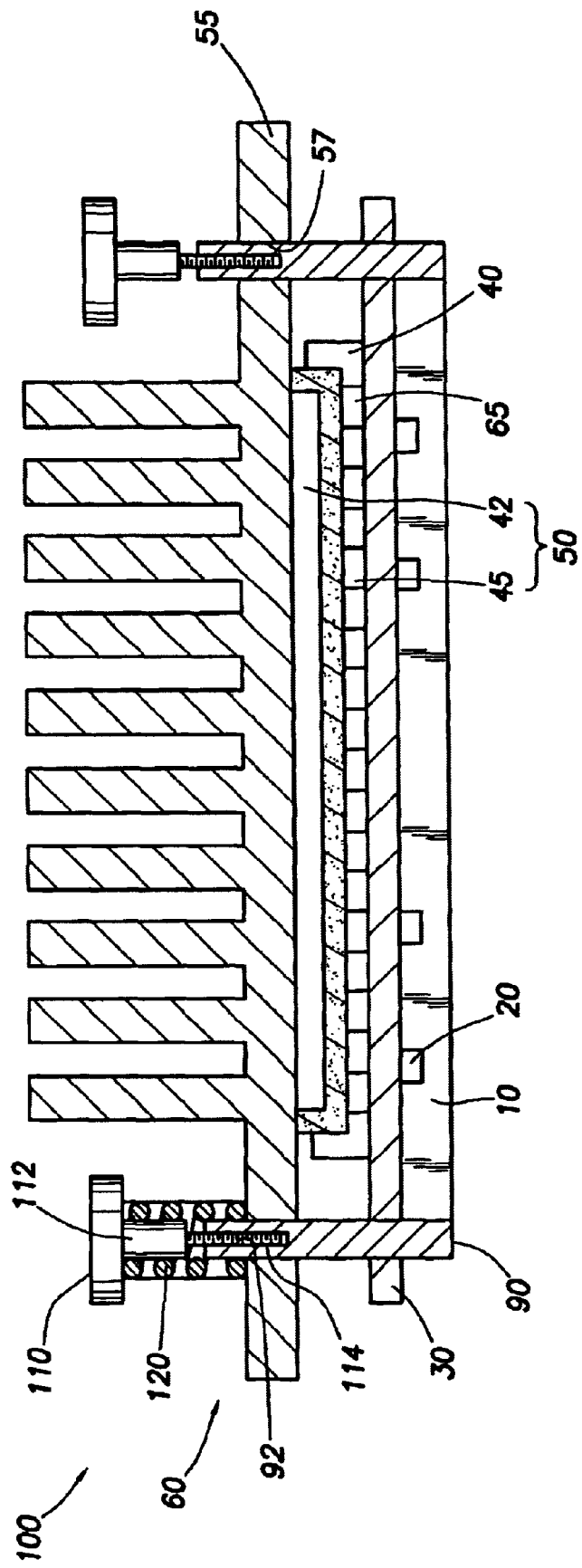
FIG. 1 is a detailed schematic diagram of a system in accordance with a preferred embodiment of the present invention.

Referring initially to FIG. 1, system 100 includes a backing plate 10 with a plurality of recesses 20, a PWB 30, interposer socket 40, a landgrid array (LGA) or processor 42, interposer columns 45, a heat sink 55, and at least one dynamic isolating mount 65. When combined, interposer columns 45 and processor 42 are referred to as CPU assembly 50. As is known in the art, heat sink 55 is held in place by an assembly 60 in such a manner as to achieve sufficient thermal contact therewith. If desired, a material such as thermal grease (not shown) can be used at the interface to enhance the flow of heat from CPU assembly into heat sink 55. Assembly 60 preferably comprises a standoff 90, a helical coil spring 120, and a capscrew 110. Each standoff 90 is mounted on or pressed into backing plate 10 and passes through a corresponding hole 57 in the base of heat sink 55. Standoff 90 each preferably comprise a generally cylindrical member having a threaded internal bore 92. Each capscrew 110 includes a head 112 and a male threaded body 114 sized to threadingly engage bore 92.

A plurality of interposer columns 45 connects PWB 30 to CPU assembly 50. While this configuration has many benefits associated with it, interposer columns 45 transfer vibrational energy from PWB 30 to CPU assembly 50.

According to a preferred embodiment, dynamic isolating mount 65 is placed between PWB 30 and CPU assembly 50. Prior to engagement of CPU assembly 50 with PWB 30, dynamic isolating mount 65 is placed on PWB 30 where PWB 30 contacts CPU assembly 50. Dynamic isolating mount 65 may comprise a continuous piece or small, fragmented pieces. Dynamic isolating mount 65 is preferably somewhat taller than the space between PWB 30 and CPU assembly 50 when it is in its natural or non-compressed state. Thus, when it is desirable to assemble system 100, CPU assembly 50 is placed on top of dynamic isolating mount and secured in place by methods known by one of ordinary skill in the art. In this manner, a dynamic isolating force is applied to CPU assembly 50 to maintain it in contact with the PWB while simultaneously damping vibrations or shocks that would otherwise be transmitted from the PWB to the CPU.

Figure 2:
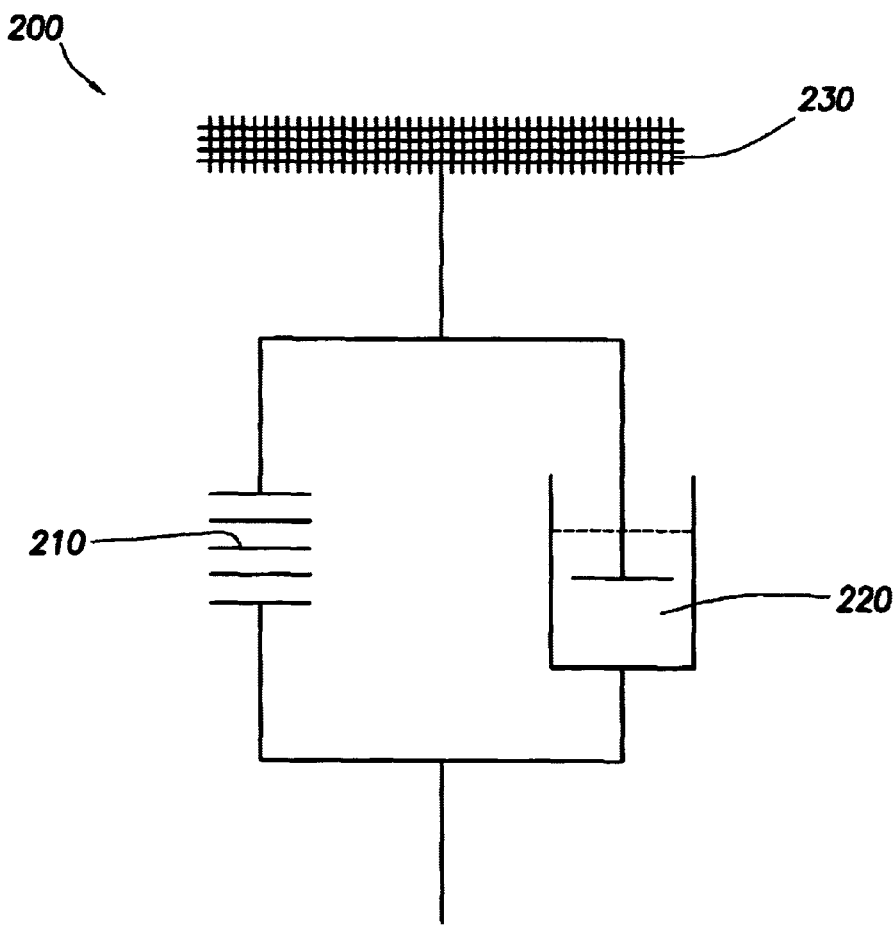
FIG. 2 is a schematic diagram of a spring-dashpot model.

In order to describe the operation of the present invention, reference will briefly be made to FIG. 2, a schematic of a simple spring-dashpot system. FIG. 2 includes a Kelvin element comprising a linear spring in parallel with a viscous damper. Kelvin model 200 includes a spring component 210, a dashpot component 220, and a fixed origin 230. In a Kelvin model, spring component 210 functions according to Hookean elastic behavior. For example, when a force is applied to spring 210 it deforms by an amount that is directly proportional to the applied force. The classical solid behavior is given by Equation 1.

$$F = kx \quad (1)$$

where F is force (stress), x is the extension distance (strain), and k is the proportionality constant. This constant is also called a modulus. The deformation is reversible when the stress is removed. However, if stress is continuously applied, a Hookean solid does not deform any further; it shows no time-dependant deformation.

Dashpot, or damper 220, functions according to Newtonian viscous behavior. For example, the applied force (stress) is proportional not to the distance (strain), but rather to the rate of strain. This classical viscous behavior is given by Equation 2.

$$F = kdx \quad (2)$$

where F is force, dx is the rate of extension (strain), and k is the proportionality constant. In shear this equation is written:

$$\tau = \eta \gamma \quad (3)$$

and the proportionality constant $\eta$ is viscosity. The damping material continues to deform as long as force is applied. The deformation is not reversible; when the force is removed, the damping material ceases to deform.

It should be understood that the only material that exhibits true Newtonian viscous behavior is a viscous liquid. In reality, a "viscous" solid displays viscous and elastic behavior. However, for explanatory purposes only, in the current invention, the interposer columns 40 are assumed to display purely elastic behavior and the dynamic isolating mount is assumed to display purely viscous behavior.

When these two components are combined, the viscoelastic behavior of the system can be modeled using the elastic and viscous elements in parallel; the strain of the two elements in parallel is the same and the total stress is the sum of the stress in the two elements. As the load is applied, the viscous element resists deformation but slowly deforms, transferring the applied stress to the elastic element. Thus, the deformation of this two-element model is limited by the extensibility of the elastic element. When load is removed, the "transient creep" strain is recovered.

More specifically, this model exhibits a "delayed elastic" or viscoelastic response to applied loads. After sudden imposition of a shear stress, spring 210 will eventually reach the expected strain, but is retarded in doing so by dashpot 220. Dashpot or dynamic isolating mount 65 of the present invention accordingly prevents column 45 from reaching its expected strain, thus limiting vibrational motion.

In order to ensure that vibrational motion is minimized, dynamic isolating mount 65 should possess the following properties. It should be resistant to temperatures is below 130° C., possess a loss factor of at least 0.010, and be easily manufactured by companies such as Sorbothane. Examples of such materials include, but are not limited to, rubbers, silicones, and neoprenes.

The simple Kelvin model described above describes a simple spring-dashpot system which is useful to understanding the following model which more accurately models the behavior of dynamic isolating mount 65.

Figure 3:
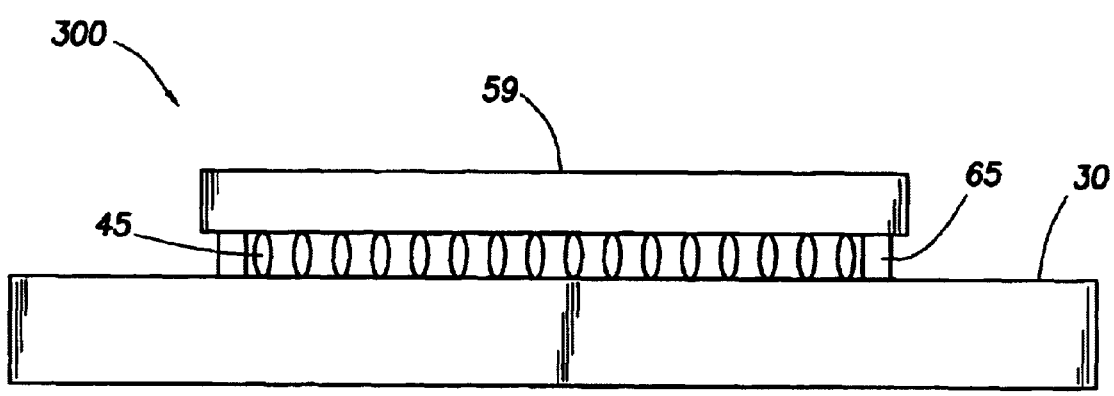
FIG. 3 is a simplified schematic diagram of a system in accordance with a preferred embodiment of the present invention.

Referring now to FIG. 3, spring-mass-dashpot system 300 preferably includes a heat sink assembly-CPU package 57, interposer columns 45, a PWB 30, and a dynamic isolator 65. Interposer columns 45 possess a total spring constant K (lb/in), heat sink assembly-CPU package 57 possesses mass W/g (lb-sec²/in), and dynamic isolator 65 possesses a damping value C (lb-sec/in). The magnification factor of a single degree of freedom spring-mass-damper system can be determined according to Equation 4:

$$X/X_0 = 1/[\{1-(\omega/\omega_n)^2\}^2 + \{2\xi(\omega/\omega_n)\}^2]^{1/2} \quad (4)$$

where:
- X is the amplitude of vibration (in),
- $X_0$ is static deflection, or $F_0/K$ (in),
- $\omega$ is frequency of excitation (rad/sec),
- $\omega_n$ is natural frequency, or $[Kg/W]^{1/2}$ (rad/sec),
- $\xi$ is a damping factor, $=C/C_0$,
- $C_0$ is critical damping, $=2W\omega_n/g$ (lb-sec/in),
- k is the spring constant of one clamping spring (lb/in),
- K is the total clamping spring constant, or nK (lb/in),
- n is the number of clamping springs, in this case 4,
- W is the weight of heat sink (lb),
- g is a gravitational constant, or 386 in/sec², and
- $F_0$ is the total static clamping force applied (lb).

For a resonant, critically damped system $\xi=1$, and Equation 4 becomes $X/X_0=0.5$. Thus, for a critically damped isolator, the dynamic amplitude will equal half of the static compression of interposer columns. Since the columns will equal eventually compress approximately 0.010", the above analysis suggests that a critically damped dynamic isolator will prevent dynamic motion greater than 0.005". Thus, using a critically damped isolator, 0.005" of compression is attainable.

The critical damping value of the dynamic isolator can be determined by Equation 5:

$$C_0 = 2W\omega_n = 2[KW/g]^{1/2} \quad (5)$$

Thus, Equation 5 defines the amount of damping necessary in the dynamic isolator to provide a critically damped system.

Critical damping refers to zero amplitude for a damped oscillator; the body returns back to its equilibrium position at an optimum rate. Critical damping is desirable because vibrational oscillations cease, preventing intermittent motion. By tuning the dynamic isolating mount 65 to equal approximately twice the product of the mass weight and natural frequency, critical damping is obtained.

In order to tune a dynamic isolating mount, a critical damping value is mathematically projected, similar to that shown in Equation 5. A material possessing a damping value equal to a fraction of the projected critical damping value is then employed as the damper. For example, according to Equation 5, if the weight of the heat sink is 0.10 lb and the natural frequency of the system is 500 rad/sec, then the critical damping value, $C_0$ is 100 lb-rad/sec, because $C_0=2W\omega_n$. If two dynamic isolating mounts are used, each mount should possess a damping factor C of approximately 50 lb-rad/sec.

The dynamic isolating mount may be produced in the form of a picture-frame, square tabs, or any form capable of damping the interposer columns, including incorporating the dynamic isolating mount into the interposer socket. Additionally, the dynamic isolating mount may be part of a Kelvin system as described above (e.g., spring and dashpot in parallel) or part of a Maxwell system (e.g., spring and dashpot in series) and the spring(s) and damper(s) need not necessarily be positioned adjacent to each other.

It should be understood that the damping assemblies and systems described herein may be used in a computer system including a chassis, a system board, and an input device. In a preferred embodiment, the input device is either a mouse or a keyboard.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A device for maintaining a microprocessor in a desired relationship with a printed wiring board while limiting the transmission of shock and vibrational motion to and from the processor, comprising:
   - a printed wiring board;
   - a processor; and
   - a dynamic isolating mount compressed between said printed wiring board and said processor;
   - said processor maintaining said dynamic isolating mount in a compressed state such that said dynamic isolation mount bears on said printed wiring board and such that the dynamic isolating mount is critically damped.

2. The device of claim 1 further comprising interposer columns.

3. The device of claim 1 wherein said dynamic isolating mount comprises a continuous piece that contacts the periphery of the processor.

4. The device of claim 1 wherein said dynamic isolating mount comprises a predetermined number of pieces that contact the periphery of the processor.

5. The device of claim 1 wherein said dynamic isolating mount comprises material resistant to temperatures below 130° C.

6. The device of claim 1 wherein the dynamic isolating mount possesses a loss factor at least 0.010.

7. The device of claim 1 wherein the dynamic isolating mount is manufactured by Sorbothane.

* * * * *